United States Patent [19]

Krebaum

[11] Patent Number: 5,952,446
[45] Date of Patent: Sep. 14, 1999

[54] ELASTOMERIC EPOXY COMPOSITION

[75] Inventor: Paul Krebaum, Lisle, Ill.

[73] Assignee: Molex Incorporated, Lisle, Ill.

[21] Appl. No.: 09/020,449

[22] Filed: Feb. 9, 1998

[51] Int. Cl.$^6$ .................................................. C08G 59/68
[52] U.S. Cl. .............................. 528/90; 528/88; 528/93; 528/94; 528/408
[58] Field of Search ................................ 528/88, 90, 93, 528/94, 408

[56] References Cited

U.S. PATENT DOCUMENTS

| | | | |
|---|---|---|---|
| 2,604,464 | 7/1952 | Segall et al. | 260/80.5 |
| 2,662,870 | 12/1953 | Allenby | 260/45.5 |
| 2,933,473 | 4/1960 | Schmitz | 260/47 |
| 3,065,195 | 11/1962 | Vasta | 260/41 |
| 3,090,793 | 5/1963 | Casement | 260/399 |
| 3,310,603 | 3/1967 | Kelly | 260/837 |
| 3,378,601 | 4/1968 | Tamaka et al. | 260/831 |
| 3,943,187 | 3/1976 | Wu | 260/837 |
| 4,212,781 | 7/1980 | Evans et al. | 260/29.4 |
| 4,283,520 | 8/1981 | Moser et al. | 528/93 |
| 4,285,847 | 8/1981 | Ting | 260/29.2 |
| 4,308,185 | 12/1981 | Evans et al. | 260/29.2 |
| 4,399,241 | 8/1983 | Ting et al. | 523/400 |
| 4,482,671 | 11/1984 | Woo et al. | 525/31 |
| 4,550,203 | 10/1985 | Stockinger et al. | 564/105 |
| 4,595,716 | 6/1986 | Woo et al. | 523/403 |
| 4,618,712 | 10/1986 | Stockinger et al. | 564/103 |
| 4,721,770 | 1/1988 | Stockinger et al. | 528/109 |
| 4,983,672 | 1/1991 | Almer et al. | 525/65 |
| 5,045,363 | 9/1991 | Almer et al. | 427/410 |
| 5,073,595 | 12/1991 | Almer et al. | 525/65 |
| 5,198,500 | 3/1993 | Muramoto et al. | 525/244 |
| 5,391,687 | 2/1995 | Shibata et al. | 528/88 |
| 5,457,149 | 10/1995 | Hall et al. | 25/523 |

FOREIGN PATENT DOCUMENTS 730670   5/1955   United Kingdom .

OTHER PUBLICATIONS

Azamide® 341 Information Sheet (not dated).
Schering Berlin Polymers, Euredur® 3141 Material Safety Data Sheet, Sep. 27, 1990.
Sherex Eureder® 3123 Material Safety Data Sheet, Jun. 17, 1989.
Shering Berlin Polymers, Eureder® 3123 Modified Polyamidoamine, Technical Data (not dated).
Evans Chemetics, Technical Data EGD1 (not dated).
Evans Chemetics, Technical Data EMDS (not dated).
Hoechst® High Chem, Oxa Acids, Jan. 1994.
Hoechst® High Chem, Oxa Acids, $2^{nd}$ edition Feb. 1995.
Dow, General Guide, Formulating with Dow Epoxy Resins (not dated).
Dow, General Guide, Formulating with Dow Epoxy Resins, 1983.
Shell Chemical Co., Technical Bulletin, EPON® Resin 815, Oct 1990.
ATO, Thioglycolic Acid, p. 17 (not dated).
Union Carbide, Cycloaliphatic Epoxides for Electrical and Electronic Applications, Oct. 1985.
Union Carbide, Cycloaliphatic Epoxide Systems, 1989.

*Primary Examiner*—Robert Dawson
*Assistant Examiner*—D. Aylward
*Attorney, Agent, or Firm*—James C. Paschall

[57] ABSTRACT

An elastomeric epoxy composition and curing agents for elastomeric epoxy compositions, the elastomeric epoxy composition being the reaction product of a substituted amide and an epoxy.

16 Claims, No Drawings

ELASTOMERIC EPOXY COMPOSITION

FIELD OF INVENTION

The present invention relates to elastomeric epoxy compositions, curing agents for elastomeric epoxy compositions and a method for making the compositions. More particularly, the invention provides curing agents that cure rapidly at low temperatures to provide epoxy compositions that are effective for use with electrical connectors and electrical components.

BACKGROUND OF THE INVENTION

Connectors and electronic components are commonly coated with resinous materials for sealing, adhesive or insulative purposes. One important resin material used as a coating in electronic applications is an epoxy polymer. Epoxy polymers are utilized because of their adhesiveness, elastomeric and insulative properties.

Epoxy-amine systems are important in a number of coating applications. Amines act as crosslinkers or curing agents to provide the epoxy-amine polymer with a variety of properties. Epoxy groups react at ambient temperatures with primary aliphatic amines to form secondary amines and with secondary amines to form tertiary amines. Reaction rates depend on epoxy and amine structure and concentration, catalysis, and media effects. Terminal epoxy groups, such as glycidyl ethers and esters, are generally more reactive than internal epoxy groups, which are more sterically hindered. Reactivity of amines tends to increase with base strength and decrease with stearic crowding. Aliphatic amines are much more reactive than aromatic amines, which are much less basic.

The reactivity of currently available epoxy-amine systems limits their uses as a coating for connectors and electronic components. For example, epoxy-amine reactivity is too high at ambient temperatures to allow sufficient storage stability of a coating containing polyamine and polyepoxide in the same package, as a result, two package systems are often required. Aliphatic amines have a pot life limited to a few hours and the coating will generally take about one day to a week to cure at ambient temperatures.

Another factor which limits the use of epoxy-amine systems as a coating for connectors and electronic components is their physical properties. Application of an epoxy-amine composition to a substrate often requires the use of organic solvent to provide suitable viscosities. Organic solvents are objectionable from an environmental standpoint and may have detrimental effects on the substrates to which they are applied. This is especially true when the coating is applied to a substrate supporting conductive ink traces. The use of organic solvents can result in the leaching and migration of metals from the conductive ink on the substrate into the coating, hence, changing the insulative properties of the coating.

Further, epoxy-amines do not provide an optimal adhesiveness or dielectric withstanding voltages to make them an effective coating for use in electronic applications.

Polyamide curing agents for epoxy resins are known in the art. However, the known polyamide curing agents do not cure through the amide group. That is, the hydrogen atom on the nitrogen atom proximate to the carbon atom double bonded to the oxygen atom does not leave the nitrogen to initiate the polymerization of the epoxide. Traditional polyamide curing agents cure through a free amine. That is, the hydrogen on the nitrogen not adjacent to the carbon atom double bonded to the oxygen atom leaves the nitrogen to initiate the polymerization of the epoxide.

It is an object of the present invention to provide an epoxy composition which is cured through an amide hydrogen.

It is an additional object of the present invention to provide an elastomeric epoxy composition that cures rapidly at low temperatures.

It is another object of the invention to provide an elastomeric epoxy composition with an adhesiveness and dielectric withstanding voltage which makes the composition effective for use on electrical connectors and electrical components.

It is a further object of the invention to provide an elastomeric epoxy composition that does not require the use of organic solvent for application to a substrate.

Other objects, advantages, features and characteristics of the present invention will become more apparent upon consideration of the following description and the appended claims.

SUMMARY OF THE INVENTION

The present invention provides elastomeric epoxy compositions that are rapidly cured at low temperatures and have an adhesiveness effective for use on electrical connectors and electronic components. The compositions of the present invention can be applied to a substrate without the use of organic solvents, and upon curing, are resistant to thermal shock and the flow of electricity so as to be effective for use as an insulative sealant for a connector or coating for a printed circuit board.

The epoxy compositions of the present invention are the reaction product of an epoxide or an epoxy polymer and a substituted amide which acts as a curing agent. In an important aspect of the invention, the substituted amide curing agent cures the epoxide through the hydrogen on the amide functional group. Additionally, the epoxy polymer preferably has a molecular weight of about 200 to 2,000 and an epoxy equivalent weight of about 100 to about 1,000.

The substituted amides of the invention include organic amides, sulfonamides and imides. The amides are the reaction product of an amine with a compound having electron withdrawing characteristics, so that the hydrogen on the amide functional group becomes more acidic. In an important aspect, polyfunctional amines, which includes diamines, useful in the invention for making organic amides or sulfonamides have a molecular weight of about 17 to about 5,000. Compounds having electron withdrawing characteristics include organic or sulfonic acids. The acids themselves, esters of the acids, anhydrides, or chlorides of the acids are reacted with the amine to provide the substituted amide. Cyclic anhydrides, esters, or ester acids are reacted with ammonia to yield imides which are one of the substituted amides of the present invention.

The properties of the resulting epoxy composition can be deliberately varied by adjusting the degree of cross-linking between the epoxy and the substituted amide and/or adjusting the molecular weight of either the epoxy or the amide. The degree of cross-linking can be increased by utilizing epoxy polymers with more epoxide functional groups and/or substited amides with more amide functional groups. Crosslinking can also be accomplished by leaving unreacted or free amino groups on the compound containing the substituted amide because amine co-curing is compatible with the base-catalyzed reaction mechanism for the amide and the epoxide.

In an important aspect, the elastomeric composition has a cure time of about 2 min. to about 15 min. at a temperature of about 110° C. to about 160° C. Further, the present invention provides curing agents that are effective for providing an elastomeric epoxy composition with an elongation percentage of at least about 10%, and a dielectric withstanding voltage of at least about 100 volts/mil.

DETAILED DESCRIPTION OF THE INVENTION

DEFINITIONS

As used in this application, "polymer" means a compound with repeating monomeric units.

As used herein "coating binder" is the polymer portion of a coating after baking and after crosslinking.

"Crosslinker" or "curing agent" means a polyfunctional substance containing more than one functional group that is capable of forming covalent bonds. Epoxy resin may be polymerized with a variety of curing agents. The selection of curing agent will depend on application techniques, pot life required, cure conditions, and physical properties desired. Besides effecting viscosity and reactivity of the formulation, curing agents will determine both the types of chemical bonds formed and the degree of crosslinking that will occur.

"Substantially solventless" means a coating composition having not more than about five weight percent organic solvent.

"Organic solvent" means a liquid which includes but is not limited to carbon and hydrogen which liquid has a boiling point in the range of from about 30° C. to about 300° C. at about one atmosphere pressure.

"Film" is formed by the application of a coating to a base or substrate and crosslinking.

One measure of coating performance is "elongation." In standard tests known in the art, a sample of material is elongated at a constant rate (strain) and the resulting stress is recorded. Stress is the force per unit of cross-sectional area applied to a material and strain is expressed in terms of percent elongation of sample or "elongation percentage". The term "elongation at break" is a measure of how much strain can be withstood before breaking and "tensile strength" or "tensile at break" is a measure of the stress when the sample breaks.

The term "adhesion" as used herein means the resistance to separation of coating and substrate. Adhesion is sometimes measured by evaluating how easily a penknife can scrape a coating from a substrate in comparison to other coatings. A cross-hatch adhesion test pursuant to ASTM D-3359 is commonly used in the art to distinguish between coatings with good adhesion and poor adhesion.

The term "dielectric withstanding voltage" means the resistance of a composition measured in volts/mil per ASTM D-3755.

The term "polyfunctional amide" means a molecule with two or more amide groups.

The term "glass transition temperature ($T_g$)" means the temperature at which a substrate begins to lose its crystalline structure.

Preparation of Substituted Amide

In an important aspect, the present invention provides substituted amides and a method for producing substituted amides. The substituted amides useful in the present invention are organic amides, sulfonamides and imides. The general approach for preparing the substituted amide of the present invention is to react a polyfunctional amine with a compound having electron withdrawing characteristics. Since typical amides are not sufficiently acidic to accept an electron from a basic catalyst at a reasonable reaction rate, the present invention provides for making amides acidic by attaching an electron withdrawing group or groups to the amide.

The organic amide and the sulfonamide are prepared by reacting a polyfunctional amine with an organic acid containing an electron withdrawing group or a sulfonic acid of which sulfone is an electron withdrawing group. The imides are prepared by reacting an anhydride with ammonia. The structure of the imide provides sufficient electron withdrawing characteristics to render the hydrogen of the amide sufficiently acidic to initiate the reaction with an epoxide group.

The attachment of an electron withdrawing group is effective for making the amine group of the amide acidic enough to accept an electron from or to donate a proton (hydrogen atom) to a basic catalyst, such as diazabicycloundecene (DBU). Increasing the acidity (or reducing the basicity) of a nucleophile such as a substituted amide increases its reaction rate with an epoxide. Normal amides are so unreactive towards epoxides that homopolymerization of the epoxide is the only reaction observed with basic catalysis. Increasing the acidity of the amide hydrogen increases its reaction rate greatly, rendering the epoxy-amide reaction predominant. Many catalytic organic bases are of just the right strength to deprotonate the amides yet not cause excessive epoxy homopolymerization.

In an important aspect, the polyfunctional amines of the invention have the following general formula $$RNH_2 \qquad (1)$$

wherein R is a hydrogen, an aromatic group or an aliphatic group. R preferably includes at least one additional amine group when an organic amide or sulfonamide is the desired product. The preferred amine is a polyglycol ether. When imides are the desired product, R is a hydrogen. Examples of amines useful in the present invention include ammonia; ethylene diamine; Jeffamine D230, D400 and T-403; diethyleneglycol bis aminopropylether and phenylene diamine.

In another important aspect of the invention, the amines of Formula (1) are reacted with compounds which are effective for providing an electron withdrawing group. Compounds effective for providing an electron withdrawing group include organic acids carrying an electron withdrawing functional group or sulfonic acids and annhydrides. It is important that the electron withdrawing group render the remaining hydrogen on the amide group reactive once the compound providing the electron withdrawing group is substituted for the free hydrogen on the amine. For example:

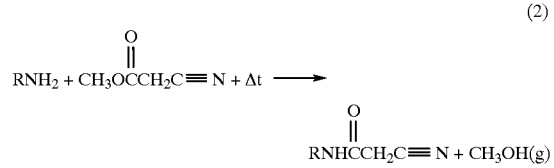

(2)

wherein R is an aromatic group or an aliphatic group. In Formula 2, the hydrogen on the nitrogen in the product is the remaining hydrogen, and

is the compound that provides an electron withdrawing group and C≡N is the electron withdrawing group. The remaining hydrogen must be more acidic than the hydrogen on the corresponding acetamide unless R is an aromatic compound. This is because the aromatic amines are not as basic as the aliphatic amines. In other words, the electron withdrawing group must render the amide more acidic than an acetamide of an aliphatic amide. These acids, esters of the acids, chlorides of the acids or linear anhydrides may be combined with an amine by known methods to yield the desired substituted amide. Cyclic anhydrides may be combined with an amine by known methods to yield a desired substituted imide. In a very important aspect of the invention, compounds which are effective for providing electron withdrawing groups include cyanoacetate, alkyl and aryl sulfonates such as methane sulfonate and benzene or toluene sulfonate, haloacetates such as trifluoro acetate, cyclic anhydrides and full or partial esters thereof or 1, 4 dicarboxylic compounds capable of forming an imide with ammonia such as 3,3',4,4'-benzophenone tetracarboxylic dianhydride ("BTDA"), pyromellitic dianhydride ("PMDA"), 3,3'4,4'-biphenyl tetracarboxylic dianhydride ("s-BPDA"), 2,2'-bis-(3,4-dicarboxyphenyl) hexafluoropropane dianhydride ("6FDA"), 4,4'-oxydiphthalic anhydride ("ODPA"), 3,3'4,4'-diphenylsufone tetracarboxylic dianhydride ("DSDA"), 5-(2,5-dioxotetrahydrol)-3-methyl-3-cyclohexene-1,2-dicarboxylic anhydride, ethylene glycol bis (anhydro-trimellitate) ("TMEG"). The foregoing is not an exhaustive list.

In an very important aspect of the invention the substituted organic amides have the general formula:

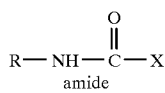

amide (3)

wherein R is an aromatic group or an aliphatic group preferably including at least one additional amide group, and X is an electron withdrawing group. An example of an organic substituted amide includes cyanoacetamide having the formulas as set forth below:

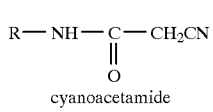

cyanoacetamide (4)

wherein R is an aromatic group or an alphatic group preferably including at least one additional amide group.

The substituted sulfonamides have the general formula:

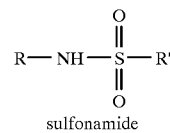

sulfonamide (5)

wherein R is an aromatic group or an aliphatic group preferably including at least one additional amide group, and R' is a hydrogen, an aromatic group or an aliphatic group.

Imides for use in the present invention have the general formula:

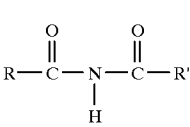

(6)

wherein either or both of R and R' is a hydrogen, an aliphatic group including an additional amide or an aromatic group including an additional amide.

The substituted amides can be stored for subsequent use or reacted directly with an appropriate epoxy compound.

An example of an imide has the specific formula:

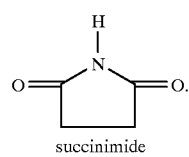

succinimide (7)

Preparation of Epoxy Resin

In this application, "epoxy polymer" means a polymer having more than one repeating monomeric unit, the polymer having terminal or pendant epoxy groups

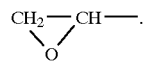

In one aspect of the invention, a bisphenol A type epoxy resin obtained by polycondensing a bisphenol such as bisphenol A with an epihalohydrin, such as epichlorohydrin, to form an epoxy resin as follows.

(8)

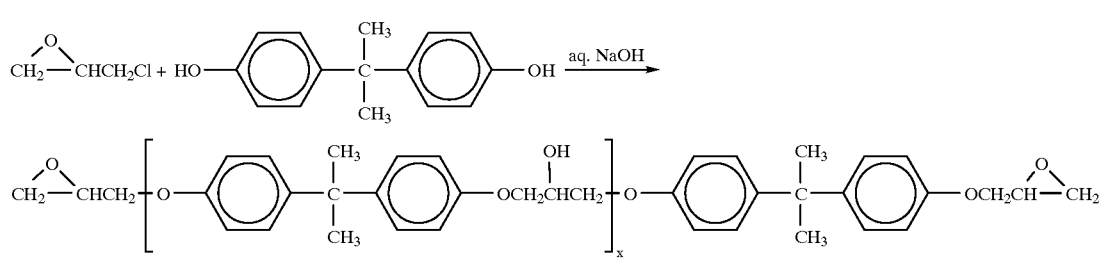

As the ratio of epichlorohydrin (ECH) to bisphenol A (BPA) is reduced, that is, as ECH/BPA approaches 1:1, the molecular weight and the x value of the epoxy resin increases. Above an average x value of 1, the resins are largely amorphous solids with increasing $T_g$.

Examples of other epoxies useful in the present invention include epoxies prepared through the reaction of ECH with bisphenol F, the structure of bisphenol F is shown below,

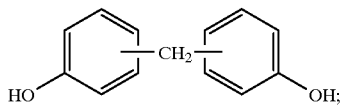

the reaction of ECH with Novolac phenolic resins, a general structure of Novolac epoxies is shown below,

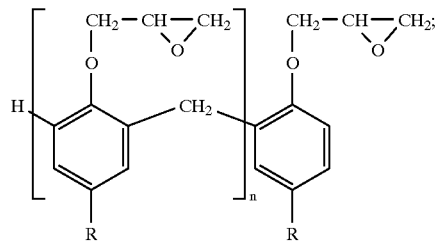

the reaction of ECH with hydrogenatated bisphenol A, the structure of hydrogenated bisphenol A is shown below,

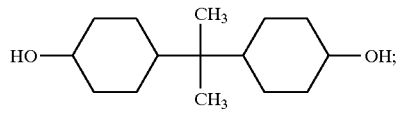

the reaction of polyols, such as glycerol, sorbitol, and polyethylene or polypropylene glycols, with ECH in the presence of a Lewis acid catalyst, the structure of polyethylene glycol diglycidyl ether shown below:

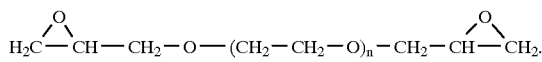

A suitable trifunctional epoxy includes the shell EPON HPT 1076 and Araldite MY 0510.

Reaction of Substituted Amide and Epoxy

An important aspect of the invention is the selection of an epoxy resin and a substituted amide that will lead to a final $T_g$ that will permit relatively complete reaction of the amine and epoxy groups at the selected cure temperature. To minimize unreacted functional groups, a combination of epoxy resin and substituted amide is chosen which is effective for providing a $T_g$ of a cured coating that ranges from below or slightly higher than the cure temperature.

Basic catalysis is necessary for the reaction to proceed. Almost any base which will be strong enough to deprotonate the amide but not too strong to cause homopolymerization will do. The preferred bases are bicyclic amines such as diazabicycloundecene (DBU).

The epoxide and the amide are cured on an epoxide equivalent weight ("EEW") to amide hydrogen equivalent weight ("AMHEW") basis. In an important aspect of the invention, the EEW to AMHEW ration preferably should be between 0.75:1.0 and 2.0:1.0. The higher EEW ratios produce harder coatings due to polycondensation of the epoxide in the presence of the basic catalyst.

In another important aspect of the invention, the reaction is conducted at a temperature of about 100° C. to about 200° C. and cures in about 1 to about 20 minutes.

The reagents and the catalyst are added together and applied such as by screen printing to a substrate to be coated. The mixture can be diluted with a solvent for one of the various applications of the invention. It is an important aspect of this invention that the composition can be applied to a substrate without use of a solvent. Upon application, the mixture may be cured to provide the desired coating.

The composition of the invention is effective for providing a coating binder having a $T_g$ of from about −60° C. to about 200° C., a hardness of at least about 40 Shore A to 90 Shore D, sufficient adhesion to pass the crosshatch adhesion test, ASTM D-3359, and an elongation percentage of at least about 10%. In an important aspect, the coating applied to a substrate is substantially solventless. In another important aspect of the invention, the coating was able to withstand voltage of at least about 500 volts/mil.

The composition of the invention may be used as a coating in a number of different applications. For example, the composition may be applied to electrical connectors, circuit boards, flexible circuitry, ink vehicles, and structural adhesives/sealants, especially for aluminum. One embodiment for joining aluminum seams incorporates a filler to enable radio frequency curing. Moreover, these compositions may be modified with chemistries such as latent catalysts, coupling agents, antioxidants, fillers, rheology modifiers, colorants and other additives to achieve specific performance goals and application requirements.

The following examples illustrate methods for carrying out the invention and should be understood to be illustrative of, but not limiting upon, the scope of the invention which is defined in the appended claims.

EXAMPLES

Example 1

To 105 grams of Jeffamine T-3000 is added 105 grams of acetonitrile in a 500 ml Erlenmeyer flask. To the magnetically stirred solution is added 0.15 mole of powdered anhydrous sodium carbonate. Over the course of 1 hour, 0.1 moles of methane sulfonyl chloride is added as a 10% solution in acetonitrile. The mixture is stirred overnight, filtered, and the filtrate freed of both solvent and traces of methane sulfonic acid by evaporation and vacuum stripping. A viscous liquid of polypropyloxy propylene amine sulfonamide results.

To 11.3 grams of the above resulting curing agent is added 1.75 grams of Shell Epon 862 Bisphenol F epoxy resin, EEW 174, and 3% by wt. of diazabicycloundecene (DBU). A 10 gram mass in a 7 cm aluminum weighing dish cures within 4 minutes at 150° C. The resulting epoxy composition could not be peeled away from the aluminum weighing dish with a knife.

Example 2

To 227 grams of Jeffamine D-400 in a 500 ml stirred round-bottom flask is added 99 grams (1.0 mole) of methyl cyanoacetate. Over the course of an hour the temperature is slowly raised to 120–150° C. and held there for about an hour. Vacuum from an aspirator pump is slowly applied to the hot mixture to strip out volatiles. The vacuum is removed and the resulting polypropyloxy propylene amine cyanoacetamide product is allowed to cool.

To 29.5 grams of the above product is added 17.8 gms of Dow Epoxy Novolac ("DEN") 431, EEW 178. Once again, 3% by wt. of DBU is added and the product cures as before.

The cured product was subjected to tensile testing which gave the following results: elongation percentage at break 60%; yield strength of 1,356 lbs. per square inch; tensile strength at break 1,075 lbs. per square inch and passage of the crosshatch adhesion to untreated Mylar test.

Example 3

An amount of 0.5 moles of 1,3 phenylenediamine is dissolved in 5 times its weight of acetonitrile in a 500 ml Erlenmeyer flask. With good stirring, 1.0 mole of acetic anhydride is slowly added at a rate to just keep the contents from boiling. Upon cooling diacetylphenylene diamine precipitates out. It is washed several times with cold acetonitrile and dried.

An amount of 7.45 grams of the diacetylphenylene is dissolved in a minimal quantity of hot N-methyl-2-pyrrolidinone and added to 17.8 grams of hot DEN 431. After cooling (with mixing), 3% by wt. of DBU is added and cured in the usual way.

Example 4

An amount of 105 grams of Jeffamine T-3000 is reacted with 0.1 moles of trifluoroacetic anhydride in 100 ml anhydrous ether. The ether and residual trifluoroacetic acid are removed at greatly reduced pressure on a rotary evaporator. 116 grams of the above resulting trifluoroacetamide, 17.4 grams of bis F epoxy, and 1.1 grams of 2,4,6 tris dimethylaminophenol are mixed and cured as in Example 3.

Example 5

An amount of 105 grams of Jeffamine T-3000 is mixed with 10.1 grams of acetic anhydride. The mixture is stripped of excess acetic acid on a rotary evaporator using a liquid nitrogen collect condenser and a two-stage mechanical vacuum pump. 111 grams of the above acetamide is mixed with 17.4 grams of bis F resin and 3% DBU catalyst. After 15 minutes at 150° C. there is no cure except localized epoxy homopolymerization due to the DBU.

Numerous modifications and variations in practice of the invention are expected to occur to those skilled in the art upon consideration of the foregoing detailed description of the invention. Consequently, such modifications and variations are intended to be included within the scope of the following claims.

I claim:

1. An elastomeric epoxy composition comprising:
the reaction product of a substituted amide and an epoxy reacted in the presence of a basic catalyst which deprotonates the substituted amide to render it more reactive with the epoxy, the substituted amide being the reaction product of an amine and a compound having electron withdrawing characteristics, the substituted amide being more acidic than an amide functional group of an acetamide of an aliphatic amine.

2. The elastomeric epoxy composition of claim 1 wherein the amine is polyfunctional.

3. The elastomeric epoxy composition of claim 1 wherein the substituted amide is an imide.

4. The elastomeric epoxy composition of claim 2 wherein the compound having electron withdrawing characteristics is an organic or sulfonic acid.

5. The elastomeric epoxy composition of claim 1 wherein the substituted amide is selected from the group consisting of sulfonamide and cyanoacetamide.

6. A polymeric composition effective for providing a coating binder having a $T_g$ of from about −60 to about 200° C., and an elongation percentage of at least about 10, the polymeric composition comprising:
a reaction product of a substituted amide and an epoxy reacted in the presence of a basic catalyst, the substituted amide being the reaction product of an amine and a compound having electron withdrawing characteristics,
the epoxy polymer having an average molecular weight of about 200 to about 2000.

7. The polymeric composition of claim 6 wherein the compound having electron withdrawing characteristics is an organic or sulfonic acid.

8. The elastomeric epoxy composition of claim 6 wherein the substituted amide is an imide.

9. A method for synthesizing an elastomeric epoxy composition comprising:
reacting a substituted amide and an epoxy in the presence of a basic catalyst, the substituted amide being the reaction product of an amine and a compound having electron withdrawing characteristics, wherein the reaction of the substituted amide and the epoxy proceeds by the basic catalyst pulling the hydrogen of the amide off the amide.

10. The composition resulting from the method of claim 9.

11. The method of claim 10 wherein the compound having electron withdrawing characteristics is an organic or sulfonic acid or an ester or a chloride of the acid.

12. The method of claim 9 wherein the compound having electron withdrawing characteristics is selected from the group consisting of cyanoacetate, aryl sulfonate, alkane sulfonate, mono, di, and tri haloacetate.

13. The method of claim 9 wherein the substituted amide is selected from the group consisting of sulfonamide and cyanoacetamide.

14. The elastomeric epoxy composition of claim 1 wherein the catalyst is diazabicycloundecene.

15. The polymeric composition of claim 6 wherein the catalyst is diazabicycloundecene.

16. The method of claim 10 wherein the catalyst is diazabicycloundecene.

* * * * *